(12) United States Patent
Kuo et al.

(10) Patent No.: US 12,176,257 B2
(45) Date of Patent: *Dec. 24, 2024

(54) SEMICONDUCTOR STRUCTURE HAVING AN ANTI-ARCING PATTERN DISPOSED ON A PASSIVATION LAYER

(71) Applicant: Taiwan Semiconductor Manufacturing Company, Ltd., Hsinchu (TW)

(72) Inventors: Sheng-An Kuo, Hsinchu (TW); Ching-Jung Yang, Taoyuan (TW); Hsien-Wei Chen, Hsinchu (TW); Jie Chen, New Taipei (TW); Ming-Fa Chen, Taichung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/352,271

(22) Filed: Jul. 14, 2023

(65) Prior Publication Data

US 2023/0360986 A1    Nov. 9, 2023

Related U.S. Application Data

(63) Continuation of application No. 17/667,564, filed on Feb. 9, 2022, now Pat. No. 11,769,704, which is a
(Continued)

(51) Int. Cl.
*H01L 23/31*    (2006.01)
*H01L 21/56*    (2006.01)
(Continued)

(52) U.S. Cl.
CPC ........ *H01L 23/3114* (2013.01); *H01L 21/561* (2013.01); *H01L 23/49816* (2013.01); *H01L 23/5389* (2013.01); *H01L 24/05* (2013.01); *H01L 24/16* (2013.01); *H01L 25/0657* (2013.01); *H01L 2224/05008* (2013.01);
(Continued)

(58) Field of Classification Search
CPC .......... H01L 23/3114; H01L 23/49816; H01L 23/5389; H01L 23/3128; H01L 23/481; H01L 23/58; H01L 2224/12105; H01L 2224/05022; H01L 2224/05099;
(Continued)

(56) References Cited

U.S. PATENT DOCUMENTS 9,000,584 B2    4/2015    Lin et al.
9,048,222 B2    6/2015    Hung et al.
(Continued)

*Primary Examiner* — Khiem D Nguyen
(74) *Attorney, Agent, or Firm* — JCIPRNET

(57) ABSTRACT

A semiconductor structure including a first semiconductor die, a second semiconductor die, a passivation layer, an anti-arcing pattern, and conductive terminals is provided. The second semiconductor die is stacked over the first semiconductor die. The passivation layer covers the second semiconductor die and includes first openings for revealing pads of the second semiconductor die. The anti-arcing pattern is disposed over the passivation layer. The conductive terminals are disposed over and electrically connected to the pads of the second semiconductor die.

20 Claims, 10 Drawing Sheets

Related U.S. Application Data continuation of application No. 16/877,508, filed on May 19, 2020, now Pat. No. 11,251,100.

(60) Provisional application No. 62/905,426, filed on Sep. 25, 2019.

(51) Int. Cl.
*H01L 23/00* (2006.01)
*H01L 23/498* (2006.01)
*H01L 23/538* (2006.01)
*H01L 25/065* (2023.01)

(52) U.S. Cl.
CPC ............ *H01L 2224/05022* (2013.01); *H01L 2224/05099* (2013.01); *H01L 2224/12105* (2013.01); *H01L 2224/16145* (2013.01); *H01L 2924/181* (2013.01)

(58) Field of Classification Search
CPC ..... H01L 2224/16145; H01L 2924/181; H01L 2224/1146; H01L 2924/00014
See application file for complete search history.

(56) References Cited

U.S. PATENT DOCUMENTS

| | | | |
|---|---|---|---|
| 9,048,233 B2 | 6/2015 | Wu et al. | |
| 9,064,879 B2 | 6/2015 | Hung et al. | |
| 9,099,396 B2* | 8/2015 | Wu | H01L 24/05 |
| 9,111,949 B2 | 8/2015 | Yu et al. | |
| 9,263,511 B2 | 2/2016 | Yu et al. | |
| 9,281,254 B2 | 3/2016 | Yu et al. | |
| 9,368,460 B2 | 6/2016 | Yu et al. | |
| 9,372,206 B2 | 6/2016 | Wu et al. | |
| 9,496,189 B2 | 11/2016 | Yu et al. | |
| 11,769,704 B2* | 9/2023 | Kuo | H01L 24/16 |
| | | | 257/666 |
| 2012/0153509 A1* | 6/2012 | Kyozuka | H01L 25/0657 |
| | | | 257/784 |
| 2015/0340329 A1* | 11/2015 | Yu | H01L 24/11 |
| | | | 257/773 |
| 2016/0118297 A1* | 4/2016 | Chen | H01L 23/3192 |
| | | | 438/127 |
| 2016/0329299 A1* | 11/2016 | Lin | H01L 23/5385 |
| 2017/0141054 A1* | 5/2017 | Yang | H01L 23/49811 |

\* cited by examiner

SEMICONDUCTOR STRUCTURE HAVING AN ANTI-ARCING PATTERN DISPOSED ON A PASSIVATION LAYER

CROSS-REFERENCE TO RELATED APPLICATION

This application a continuation application of and claims the priority benefit of U.S. application Ser. No. 17/667,564, filed on Feb. 9, 2022, now U.S. Pat. No. 11,769,704. The U.S. application Ser. No. 17/667,564 is a continuation application of and claims the priority benefit of U.S. application Ser. No. 16/877,508, filed on May 19, 2020, now U.S. Pat. No. 11,251,100. The U.S. application Ser. No. 16/877, 508 claims the priority benefit of U.S. provisional application Ser. No. 62/905,426, filed on Sep. 25, 2019. The entirety of the each of above-mentioned patent applications is hereby incorporated by reference herein and made a part of this specification.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area. As the demand for miniaturization, higher speed and greater bandwidth, as well as lower power consumption and latency has grown recently, there has grown a need for smaller and more creative packaging techniques of semiconductor dies. Currently, System-on-Integrated-Circuit (SoIC) components are becoming increasingly popular for their multi-functions and compactness. However, there are challenges related to packaging process of the SoIC components.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
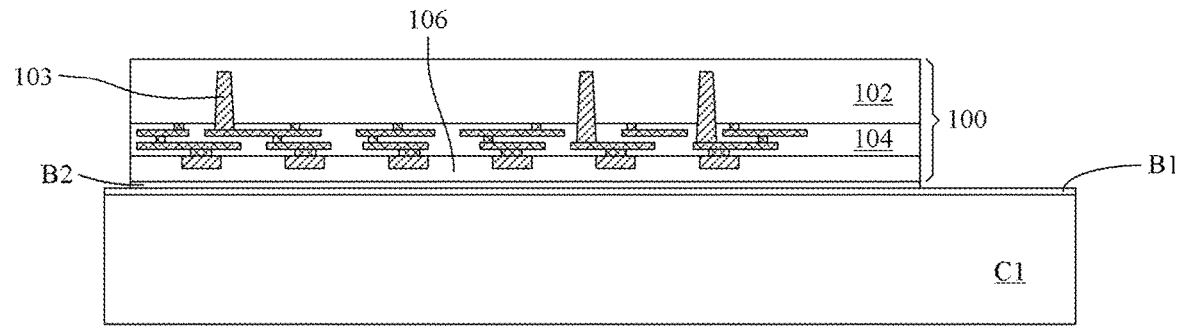
FIG. 1 through FIG. 11 are cross-sectional views schematically illustrating a process flow for fabricating an SoIC component in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1 through FIG. 11 are cross-sectional views schematically illustrating a process flow for fabricating an SoIC component in accordance with some embodiments of the present disclosure.

Referring to FIG. 1, a first carrier C1 including a bonding layer B1 formed on a top surface thereof is provided. The first carrier C1 may be a semiconductor wafer, and the bonding layer B1 may be a bonding layer prepared for fusion bond. In some embodiments, the bonding layer B1 is a deposited layer formed over the top surface of the first carrier C1. In some alternative embodiments, the bonding layer B1 is a portion of the first carrier C1 for fusion bond. For example, the material of the first carrier C1 includes silicon or other suitable semiconductor materials, and the material of the bonding layer B1 includes silicon (Si), silicon dioxide ($SiO_2$) or other suitable bonding materials.

One or more semiconductor dies 100 (e.g., logic dies) are provided and placed on the top surface of the bonding layer B1. In FIG. 1, only one semiconductor die 100 is illustrated, however, the number of the semiconductor die 100 is not limited. The semiconductor die 100 may include an active surface (i.e. front surface) and a back surface opposite to the active surface. The semiconductor die 100 is placed on the top surface of the bonding layer B1 such that the active surface of the semiconductor die 100 faces the bonding layer B1 carried by the first carrier C1. The semiconductor die 100 may include a bonding layer B2 formed on the active surface thereof. After the semiconductor die 100 is placed on the top surface of the bonding layer B1, the bonding layer B2 is in contact with the bonding layer B1. In an embodiment where multiple semiconductor dies are picked-up and placed on the bonding layer B1, the semiconductor dies may be placed onto the bonding layer B1 in a side-by-side manner such that semiconductor dies are arranged in array and spaced apart from each other. In some embodiments, the material of the bonding layer B2 includes silicon (Si), silicon dioxide (SiO$_2$) or other suitable bonding materials.

The semiconductor die 100 may include a semiconductor substrate 102 having semiconductor devices formed therein, an interconnect structure 104 disposed on the semiconductor substrate 102 and electrically connected to semiconductor devices formed in the semiconductor substrate 102, and a dielectric layer 106 covering the interconnect structure 104. The dielectric layer 106 of the semiconductor die 100 is covered by the bonding layer B2. The semiconductor die 100 may further include through semiconductor vias (TSVs) 103 formed in the semiconductor substrate 102 and electrically connected to interconnect wirings of the interconnect structure 104. As illustrated in FIG. 1, the TSVs 103 are embedded in the semiconductor substrate 102 and the interconnect structure 104, and the TSVs 103 are not revealed from the back surface of the semiconductor substrate 102.

After the semiconductor die 100 is picked up and placed on the bonding layer B1, a chip-to-wafer fusion bonding process may be performed such that a fusion bonding interface is formed between the bonding layer B1 and the bonding layer B2. For example, the fusion bonding process for bonding the bonding layer B1 and the bonding layer B2 is performed at temperature ranging from about 100 Celsius degree to about 290 Celsius degree. The bonding layer B1 may be directly bonded to the bonding layer B2. In other words, there is no intermediate layer formed between the bonding layer B1 and the bonding layer B2. The above-mentioned fusion bonding interface formed between the bonding layer B1 and the bonding layer B2 may be a Si—Si fusion bonding interface, a Si—SiO$_2$ fusion bonding interface, a SiO$_2$—SiO$_2$ fusion bonding interface or other suitable fusion bonding interface.

Figure 2:
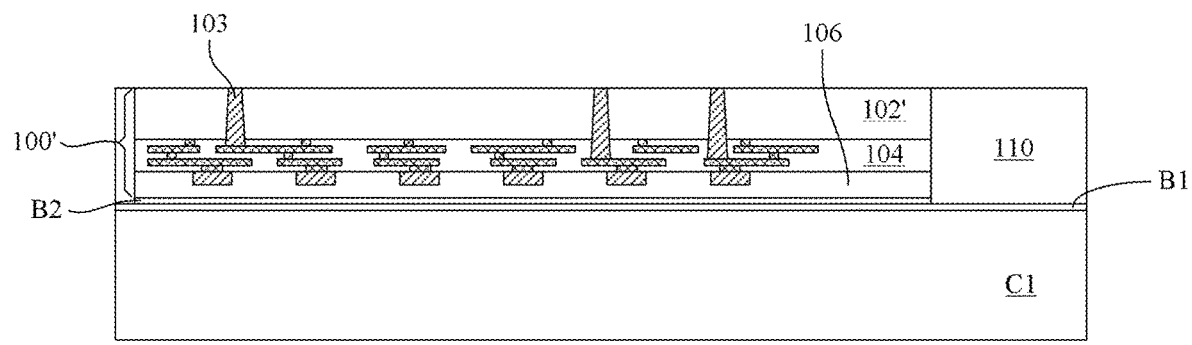

Referring to FIG. 1 and FIG. 2, after the semiconductor die 100 is bonded to the first carrier C1 through the bonding layer B1 and the bonding layer B2, an insulating material is formed to cover the bonding layer B1, the bonding layer B2, and the semiconductor die 100. In some embodiments, the insulating material is formed by an over-molding process or a film deposition process such that a portion of the top surface of the bonding layer B1, side surfaces of the bonding layer B2, and a back surface and side surfaces of the semiconductor die 100 are encapsulated by the insulating material. After performing the over-molding process or film deposition process, a grinding process may be performed to reduce the thickness of the insulating material and the thickness of the semiconductor die 100 such that semiconductor die 100' with reduced thickness and a first insulating encapsulation 110 are formed over the bonding layer B1. In some embodiments, the grinding process for reducing the thickness of the insulating material and the thickness of the semiconductor die 100 includes a mechanical grinding process, a chemical mechanical polishing (CMP) process, or combinations thereof.

As illustrated in FIG. 2, in some embodiments, the thickness of the semiconductor die 100' is equal to the thickness of the first insulating encapsulation 110, and the semiconductor die 100' and the bonding layer B2 are laterally encapsulated by the first insulating encapsulation 110. In other words, the first insulating encapsulation 110 is merely in contact with the side surfaces of the semiconductor die 100' and the bonding layer B2, and back surface of the semiconductor substrate 102' is accessibly revealed from the first insulating encapsulation 110. In some alternative embodiments, not illustrated in FIG. 2, the thickness of the semiconductor die is slightly less than or greater than the thickness of the first insulating encapsulation due to polishing selectivity of the grinding process. In other words, the top surface of the first insulating encapsulation may be slightly higher than or slightly lower than the back surface of the semiconductor die.

Figure 3:
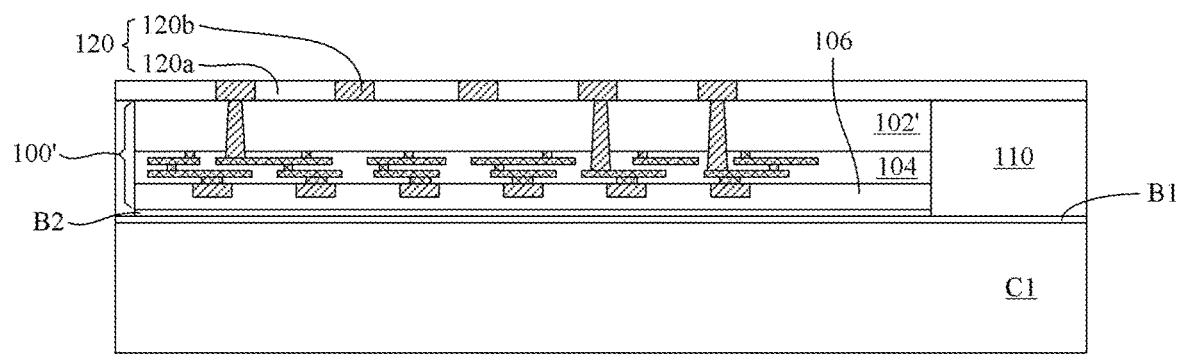

Referring to FIG. 3, a bonding structure 120 is formed over the back surface of the semiconductor die 100' and the revealed surface of the first insulating encapsulation 110. In other words, the bonding structure 120 may entirely cover the back surface of the semiconductor substrate 102' and the revealed surface of the first insulating encapsulation 110. The bonding structure 120 may include a dielectric layer 120a and conductors 120b each penetrating through the dielectric layer 120a. The material of the dielectric layer 120a may be silicon oxide (SiO$_x$, where x>0), silicon nitride (SiN$_x$, where x>0), silicon oxynitirde (SiO$_x$N$_y$, where x>0 and y>0) or other suitable dielectric material, and the conductors 120b may be conductive vias (e.g., copper vias), conductive pads (e.g., copper pads) or combinations thereof.

Figure 4:
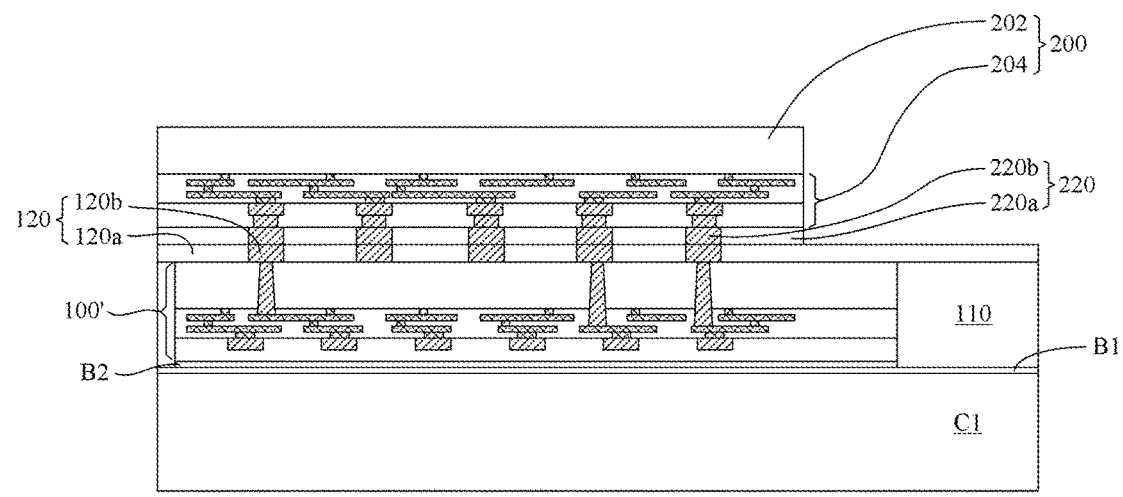

Referring to FIG. 4, one or more semiconductor dies 200 (e.g., memory dies, logic dies or other suitable dies) are provided and placed on a portion of the bonding structure 120. In FIG. 4, only one semiconductor die 200 is illustrated, however, the number of the semiconductor die 200 is not limited. In some embodiments, the semiconductor die 200 is placed on bonding structure 120 and stacked above the semiconductor die 100'. The semiconductor die 200 may include a semiconductor substrate 202, an interconnect structure 204 disposed on the semiconductor substrate 202, and a bonding structure 220 disposed on and electrically connected to the interconnect structure 204. The bonding structures 220 of the semiconductor die 200 is in contact with a portion of the bonding structure 120. The bonding structure 220 may include a dielectric layer 220a and conductors 220b each penetrating through the dielectric layer 220a. The material of the dielectric layer 220a may be silicon oxide (SiO$_x$, where x>0), silicon nitride (SiN$_x$, where x>0), silicon oxynitirde (SiO$_x$N$_y$, where x>0 and y>0) or other suitable dielectric material, and the conductors 220b may be conductive vias (e.g., copper vias), conductive pads (e.g., copper pads) or combinations thereof.

The conductors 220b of the bonding structure 220 are aligned with the conductors 120b of the bonding structure 120, and sub-micron alignment precision between the semiconductor die 200 and the semiconductor die 100' may be achieved. Once the bonding structures 220 are aligned precisely with the bonding structure 120, a chip-to-wafer hybrid bonding is performed such that the bonding structure 220 of the semiconductor die 200 is hybrid bonded to the bonding structure 120. In other words, the semiconductor die 200 and the semiconductor die 100' may be bonded through a face-to-back hybrid bonding process.

In some embodiments, to facilitate chip-to-wafer hybrid bonding between the bonding structure 120 and the bonding structure 220, surface preparation for bonding surfaces of the bonding structure 120 and the bonding structure 220 is performed. The surface preparation may include surface cleaning and activation, for example. Surface cleaning may be performed on the bonding surfaces of the bonding structure 120 and the bonding structure 220 to remove particles on bonding surfaces of the conductors 120b, the dielectric layer 120a, the conductors 220b, and the dielectric layer 220a. The bonding surfaces of the bonding structures 120 and the bonding structure 220 are cleaned by wet cleaning, for example. Not only particles may be removed, but also native oxide formed on the bonding surfaces of the conductors 120b and the conductors 220b may be removed. The native oxide formed on the bonding surfaces of the conductors 120b and the conductors 220b may be removed by chemicals used in the wet cleaning.

After cleaning the bonding surfaces of the bonding structures 120 and the bonding structure 220, activation of the top surfaces of the dielectric layer 120a and the dielectric layer 220a may be performed for development of high bonding strength. In some embodiments, plasma activation is performed to treat and activate the bonding surfaces of the dielectric layer 120a and the dielectric layer 220a. When the activated bonding surface of the dielectric layer 120a is in contact with the activated bonding surface of the dielectric layer 220a, the dielectric layer 120a and the dielectric layer 220a are pre-bonded. The bonding structure 220 and the bonding structure 120 are pre-bonded through a pre-bonding of the dielectric layer 120a and the dielectric layer 220a. After the pre-bonding of the dielectric layer 120a and the dielectric layer 220a, the conductors 120b are in contact with the conductors 220b.

After the pre-bonding of the dielectric layer 120a and the dielectric layer 220a, a hybrid bonding of the semiconductor die 200 and the bonding structure 120 is performed. The hybrid bonding of the semiconductor die 200 and the bonding structure 120 may include a treatment for dielectric bonding and a thermal annealing for conductor bonding. The treatment for dielectric bonding is performed to strengthen the bonding between the dielectric layer 120a and the dielectric layer 220a. The treatment for dielectric bonding may be performed at temperature ranging from about 100 Celsius degree to about 150 Celsius degree, for example. After performing the treatment for dielectric bonding, the thermal annealing for conductor bonding is performed to facilitate the bonding between the conductors 120b and the conductors 220b. The thermal annealing for conductor bonding may be performed at temperature ranging from about 300 Celsius degree to about 400 Celsius degree, for example. The process temperature of the thermal annealing for conductor bonding is higher than that of the treatment for dielectric bonding. Since the thermal annealing for conductor bonding is performed at relative higher temperature, metal diffusion and grain growth may occur at bonding interfaces between the conductors 120b and the conductors 220b. After performing the thermal annealing for conductor bonding, the dielectric layer 120a is bonded to the dielectric layer 220a, and the conductors 120b are bonded to the conductors 220b. The conductor bonding between the conductors 120b and the conductors 220b may be via-to-via bonding, pad-to-pad bonding or via-to-pad bonding.

Figure 5:
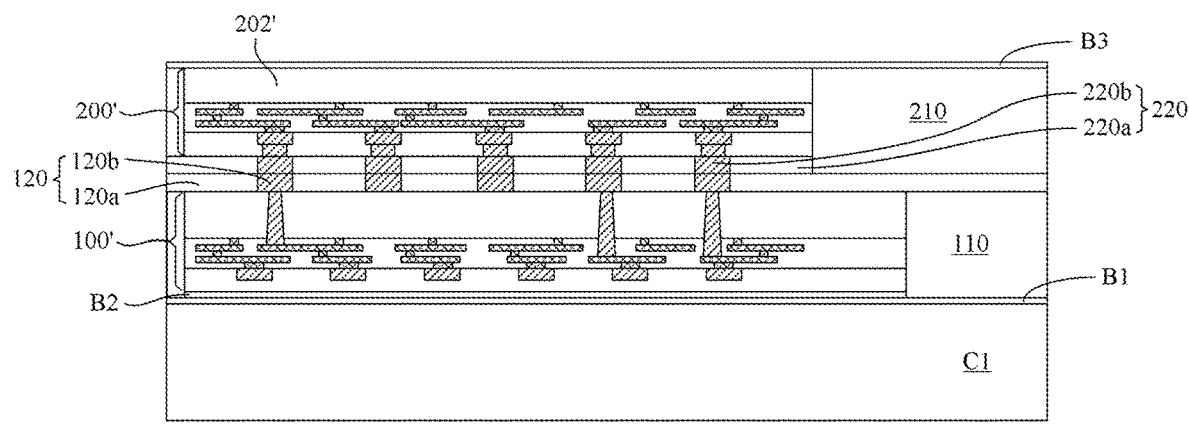

Referring to FIG. 4 and FIG. 5, after the semiconductor die 200 is bonded to the semiconductor die 100' through the bonding structure 120 and the bonding structure 220, an insulating material is formed to cover the bonding structure 120, the bonding structure 220, and the semiconductor die 200. In some embodiments, the insulating material is formed by an over-molding process or a film deposition process such that a portion of the top surface of the bonding structure 120, side surfaces of the bonding structure 220, and a back surface and side surfaces of the semiconductor die 200 are encapsulated by the insulating material. After performing the over-molding process or film deposition process, a grinding process may be performed to reduce the thickness of the insulating material and the thickness of the semiconductor die 200 such that a semiconductor die 200' with reduced thickness and a second insulating encapsulation 210 are formed over the bonding structure 120. After performing the grinding process, a semiconductor substrate 202' having reduced thickness is accessibly revealed from the second insulating encapsulation 210. In some embodiments, the grinding process for reducing the thickness of the insulating material and the thickness of the semiconductor die 200 includes a mechanical grinding process, a chemical mechanical polishing (CMP) process, or combinations thereof.

As illustrated in FIG. 5, in some embodiments, the thickness of the semiconductor die 200' is equal to the thickness of the second insulating encapsulation 210, and the semiconductor die 200' and the bonding structure 220 are laterally encapsulated by the second insulating encapsulation 210. In other words, the second insulating encapsulation 210 is merely in contact with side surfaces of the semiconductor die 200' and the bonding structure 220, and the back surface of the semiconductor die 200' is accessibly revealed from the second insulating encapsulation 210. In some alternative embodiments, not illustrated in FIG. 5, the thickness of the semiconductor die is slightly less than or greater than the thickness of the second insulating encapsulation due to polishing selectivity of the grinding process. In other words, the top surface of the second insulating encapsulation may be slightly higher than or slightly lower than the back surface of the semiconductor die. Furthermore, the first insulating encapsulation 110 is spaced apart from the second insulating encapsulation 210 by the bonding structure 120.

A bonding layer B3 is formed to cover the back surface of the semiconductor substrate 202' and the revealed surface of the second insulating encapsulation 210. The bonding layer B3 may be a bonding layer prepared for fusion bond. In some embodiments, the bonding layer B3 is a deposited layer formed over the back surface of the semiconductor substrate 202' and the revealed surface of the second insulating encapsulation 210. For example, the material of the bonding layer B3 includes silicon (Si), silicon dioxide ($SiO_2$) or other suitable bonding materials.

Figure 6:
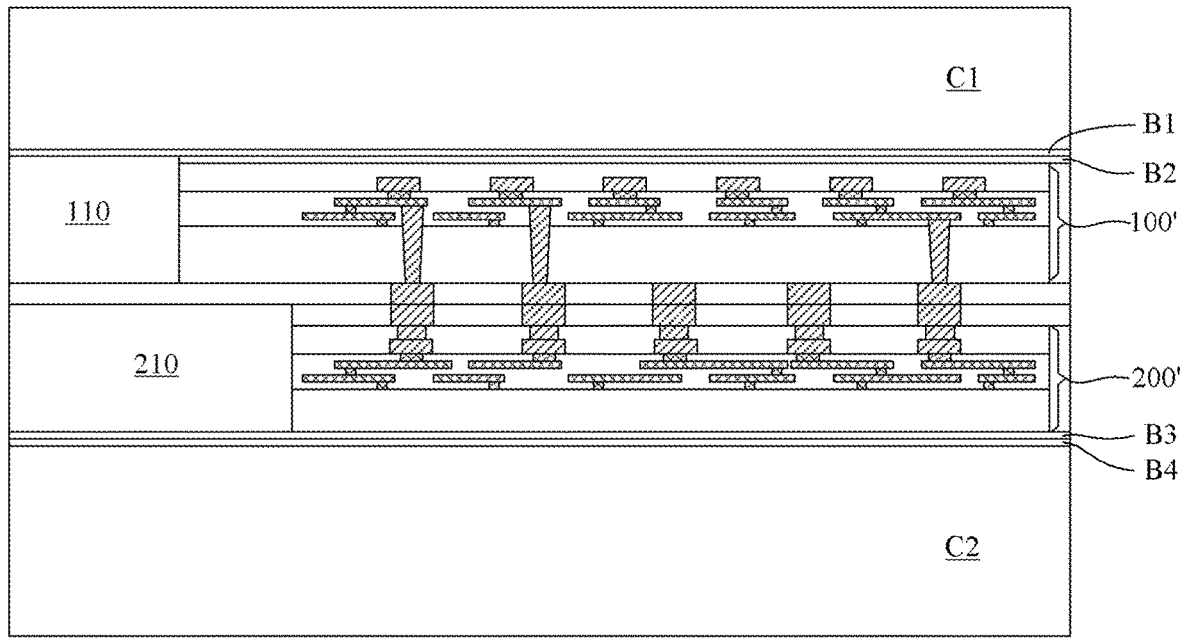

Referring to FIG. 6, a second carrier C2 including a bonding layer B4 formed on a top surface thereof is provided. The second carrier C2 may be a semiconductor wafer, and the bonding layer B4 may be a bonding layer prepared for fusion bond. In some embodiments, the bonding layer B4 is a deposited layer formed over the top surface of the second carrier C2. In some alternative embodiments, the bonding layer B4 is a portion of the second carrier C2 for fusion bond. For example, the material of the second carrier C2 includes silicon or other suitable semiconductor materials, and the material of the bonding layer B4 includes silicon (Si), silicon dioxide ($SiO_2$) or other suitable bonding materials.

The resulted structure formed on the first carrier C1 is flipped upside down and transfer-bonded to the bonding layer B4 carried by the second carrier C2 such that the bonding layer B3 is in contact with and bonded to the bonding layer B4. In some embodiments, a wafer-to-wafer fusion bonding process is performed such that a fusion bonding interface is formed between the bonding layer B3 and the bonding layer B4. For example, the fusion bonding process for bonding the bonding layer B3 and the bonding layer B4 is performed at temperature ranging from about 100 Celsius degree to about 290 Celsius degree. The bonding layer B3 may be directly bonded to the bonding layer B4. In other words, there is no intermediate layer formed between the bonding layer B3 and the bonding layer B4. Furthermore, the fusion bonding interface formed between the bonding layer B3 and the bonding layer B4 may be a Si—Si fusion bonding interface, a Si—$SiO_2$ fusion bonding interface, a SiO$_2$—SiO$_2$ fusion bonding interface or other suitable fusion bonding interfaces.

Figure 7:
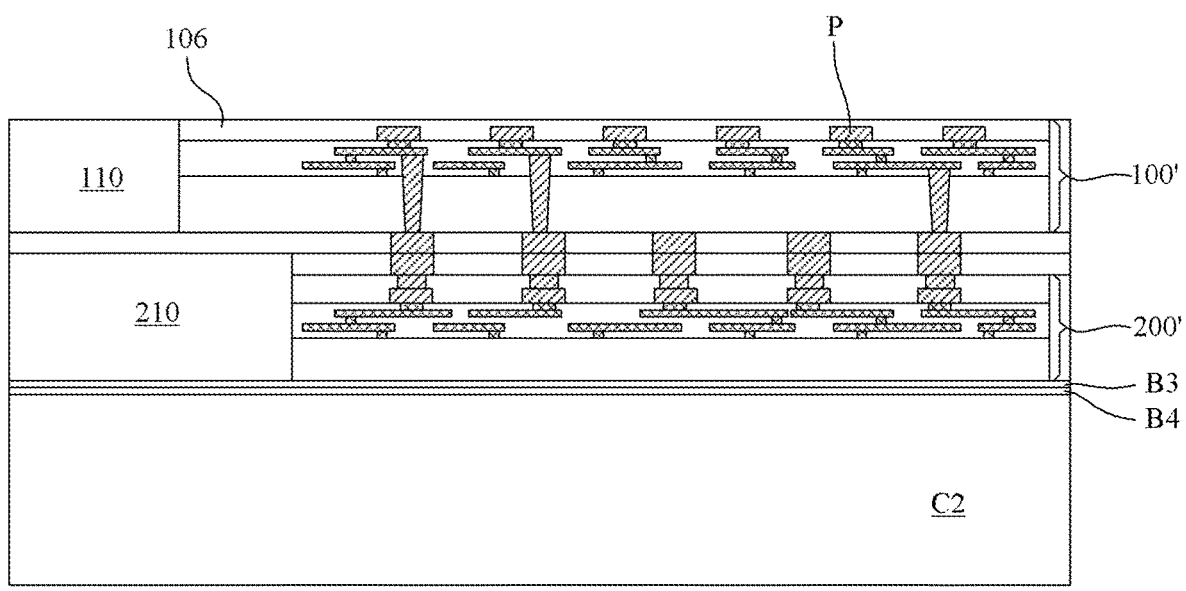

Referring to FIG. 6 and FIG. 7, after bonding the bonding layer B3 and the bonding layer B4, a de-bonding process may be performed such that the bonding layer B1 is de-bonded from the bonding layer B2 and the first insulating encapsulation 110. The de-bonding process may be a laser lift-off process or other suitable de-bonding processes. After removing the bonding layer B1 and the first carrier C1, a grinding process may be performed such that the bonding layer B2 is removed to expose a surface of the dielectric layer 106. During the removal of the bonding layer B2, the first insulating encapsulation 110 may be thinned down. In addition, after the removal of the bonding layer B2, the first insulating encapsulation 110 and the and the dielectric layer 106 may be further thinned down. In some embodiments, the removal of the bonding layer B2 and the thinning of the first insulating encapsulation 110 and the dielectric layer 106 may be performed by a same grinding process (e.g., a CMP process). As illustrated in FIG. 7, after performing the grinding process, the semiconductor die 100' is revealed, but pads P (e.g., copper pads) of the semiconductor die 100' are not revealed and covered by the dielectric layer 106.

Figure 8:
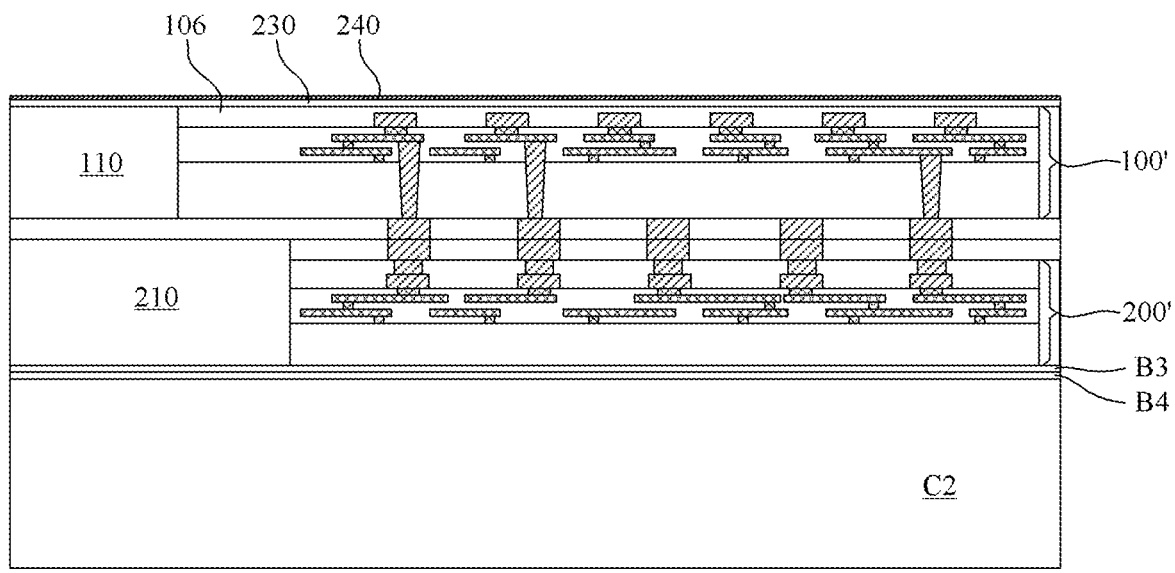

Referring to FIG. 8, a passivation layer 230 is formed to cover the first insulating encapsulation 110 and the dielectric layer 106 of the semiconductor die 100'. The passivation layer 230 may be formed through chemical vapor deposition (CVD) or other suitable depositions. In some embodiments, the passivation layer 230 includes silicon oxide layer, silicon nitride layer, silicon oxynitride layer or other suitable dielectric layer. An anti-arcing material layer or a charge spreading pattern 240 is formed on the passivation layer 230. The anti-arcing material layer 240 may be formed through sputtering, chemical vapor deposition (CVD) or other suitable depositions. In some embodiments, the anti-arcing material layer 240 includes a conductive layer, such as a sputtered titanium (Ti) layer, a sputtered Ti—Cu alloy layer, a sputtered tantalum (Ta) layer or other suitable metallic materials. The thickness of the anti-arcing material layer 240 may range from about 10 angstroms to about 1000 angstroms. The thickness of the anti-arcing material layer 240 may be modified.

Figure 9:
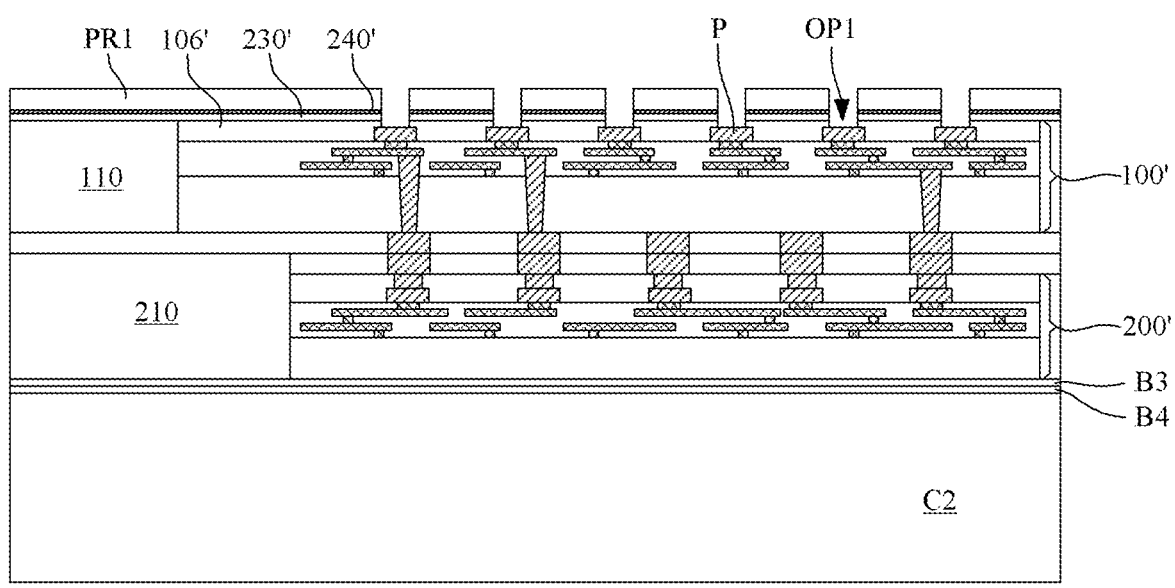

Referring to FIG. 8 and FIG. 9, a patterning process of the dielectric layer 106, the passivation layer 230, and the anti-arcing material layer 240 is performed such that a patterned dielectric layer 106', a patterned passivation layer 230', and an anti-arcing pattern 240' are formed. Multiple first openings OP1 are formed in the patterned dielectric layer 106', the patterned passivation layer 230', and the anti-arcing pattern 240' such that top surfaces of the pads P (e.g., copper pads) of the semiconductor die 100' are partially exposed by the first openings OP1. In some embodiments, a photolithography process is performed to form a patterned photoresist layer PR1 on the anti-arcing material layer 240, and an etching process (e.g. a dry etching process) is performed to remove portions of the dielectric layer 106, the passivation layer 230, and the anti-arcing material layer 240 that are not covered by the patterned photoresist layer PR1 until the top surfaces of the pads P (e.g., copper pads) of the semiconductor die 100' are partially exposed.

In an embodiment where the first openings OP1 are formed by a dry etching process (e.g., a plasma dry etching process), since charge accumulation occurred around the first openings OP1 is minimized by the anti-arcing material layer 240 or the anti-arcing pattern 240', arcing damage issue of the pads P (e.g., copper pads) of the semiconductor die 100' may be improved. In some embodiments, the anti-arcing pattern 240' includes a conductive pattern, such as a sputtered titanium (Ti) pattern, a sputtered Ti—Cu alloy pattern, a sputtered tantalum (Ta) pattern or other suitable metallic pattern. The thickness of the anti-arcing material layer pattern 240' may range from about 10 angstroms to about 1000 angstroms. The thickness of the anti-arcing pattern 240' may be modified to minimize charge accumulation and provide proper anti-arcing function.

Figure 10:
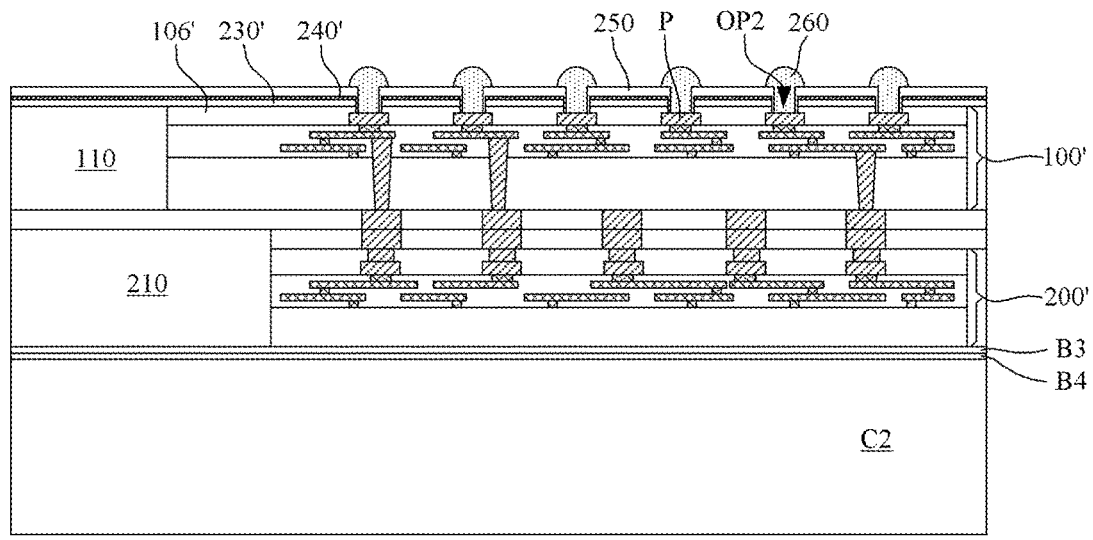

Referring to FIG. 9 and FIG. 10, after forming the first openings OP1, the patterned photoresist layer PR1 is removed from the anti-arcing pattern 240'. After the removal of the patterned photoresist layer PR1, a post passivation layer 250 including second openings OP2 is formed to cover the patterned dielectric layer 106', the patterned passivation layer 230', and the anti-arcing pattern 240'. The post passivation layer 250 may extend into the first openings OP1 (illustrated in FIG. 9), and portions of the pads P of the semiconductor die 100' are revealed by the second openings OP2 defined in the post passivation layer 250. A plating process may be performed such that multiple conductive terminals 260 are formed on the revealed portions of the pads P of the semiconductor die 100'. As illustrated in FIG. 10, the conductive terminals 260 may land on the pads P of the semiconductor die 100', fill the second openings OP2 defined in the post passivation layer 250, and protrude from the top surface of the post passivation layer 250. Furthermore, the conductive terminals 260 may be spaced apart from the anti-arcing pattern 240' by the post passivation layer 250. The anti-arcing pattern 240' may be electrically insulated from the conductive terminals 260. For example, the anti-arcing pattern 240' is electrically floating. In some embodiments, as illustrated in FIG. 10, no seed layer is formed between the conductive terminals 260 and the post passivation layer 250.

Figure 11:
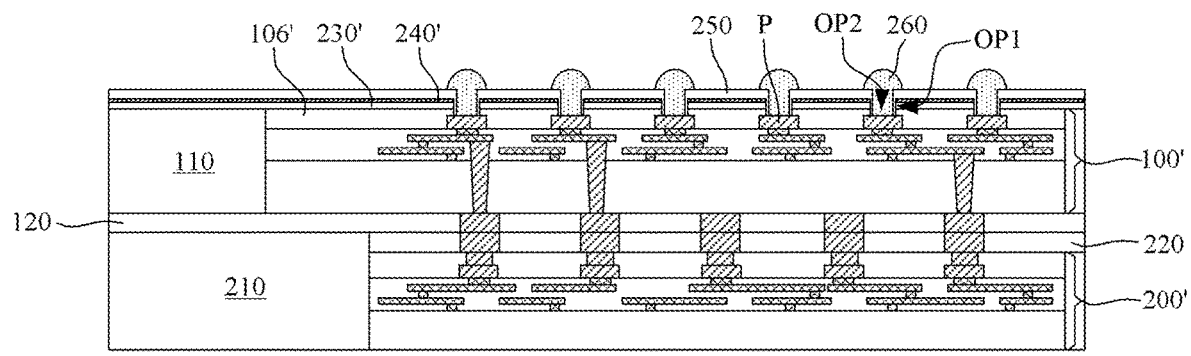

Referring to FIG. 10 and FIG. 11, after forming the conductive terminals 260, a de-bonding process is performed such that an SoIC de-bonded from the carrier C2 is obtained. In some other embodiments where multiple semiconductor dies 100' and multiple semiconductor dies 200' are used, a singulation process is further performed such that multiple singulated SoICs are obtained.

As illustrate in FIG. 11, the SoIC may include a semiconductor die (i.e. first semiconductor die or bottom tier semiconductor die) 200', a semiconductor die (i.e. second semiconductor die or top tier semiconductor die) 100', a passivation layer 230', an anti-arcing pattern 240', a post passivation layer 250, and conductive terminals 260. The semiconductor die 100' is stacked over the semiconductor die 200'. The semiconductor die 100' may be bonded to the semiconductor die 200' through a face-to-back hybrid bonding process. The semiconductor die 100' may be bonded to the semiconductor die 200' through the bonding structure 120 and the bonding structure 220, and the semiconductor die 100' is electrically connected the semiconductor die 200' through the bonding structures 120 and 220. The passivation layer 230' covers the semiconductor die 100' and includes first openings OP1 for revealing pads P (e.g., copper pads) of the semiconductor die 100'. The anti-arcing pattern 240' is disposed over the passivation layer 230', and the anti-arcing pattern 240' is distributed outside the first openings OP1 of the passivation layer 230'. For example, the anti-arcing pattern 240' is disposed on a top surface of the passivation layer 230'. In other words, the anti-arcing pattern 240' may be disposed between the post passivation layer 250 and the passivation layer 230'. The post passivation layer 250 may cover the passivation layer 230' and the anti-arcing pattern 240'. The post passivation layer 250 may extend into the first openings OP1 and includes second openings OP2 for revealing portions of the pads P of the semiconductor die 100'. For example, the post passivation layer 250 may extend along sidewall of the first openings OP1. The conductive terminals 260 are disposed over and electrically connected to the pads P of the semiconductor die 100'. Furthermore, the conductive terminals 260 may be spaced apart from sidewalls of the anti-arcing pattern 240' by the post passivation layer 250.

Figure 12:
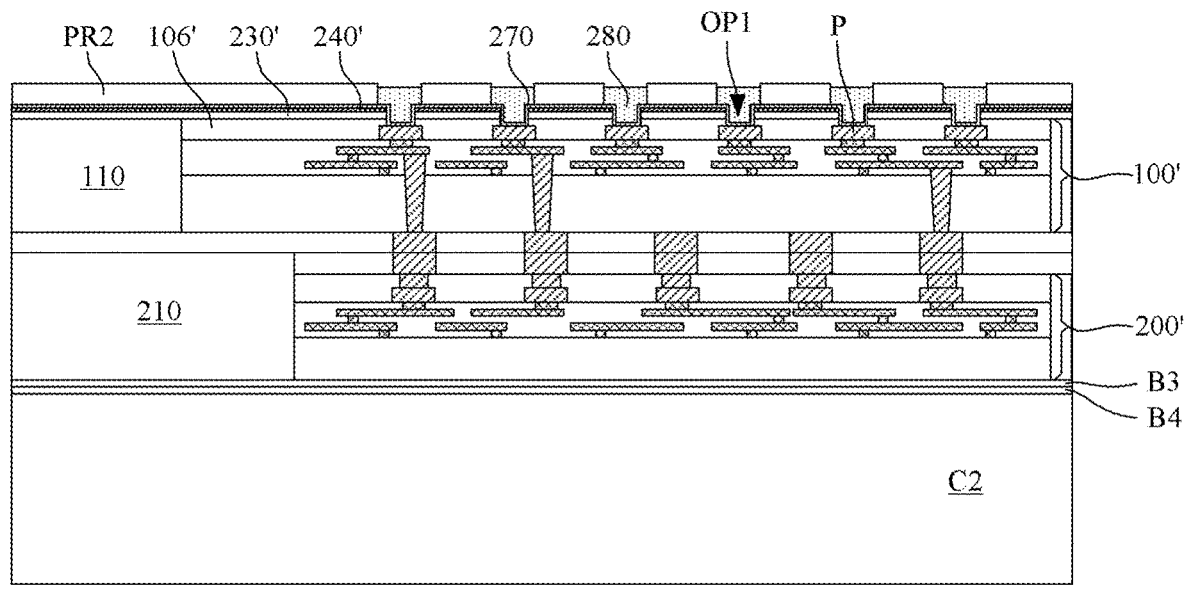
FIG. 12 and FIG. 14 are a cross-sectional view schematically illustrating another process flow for fabricating an SoIC component in accordance with some embodiments of the present disclosure.
Figure 14:
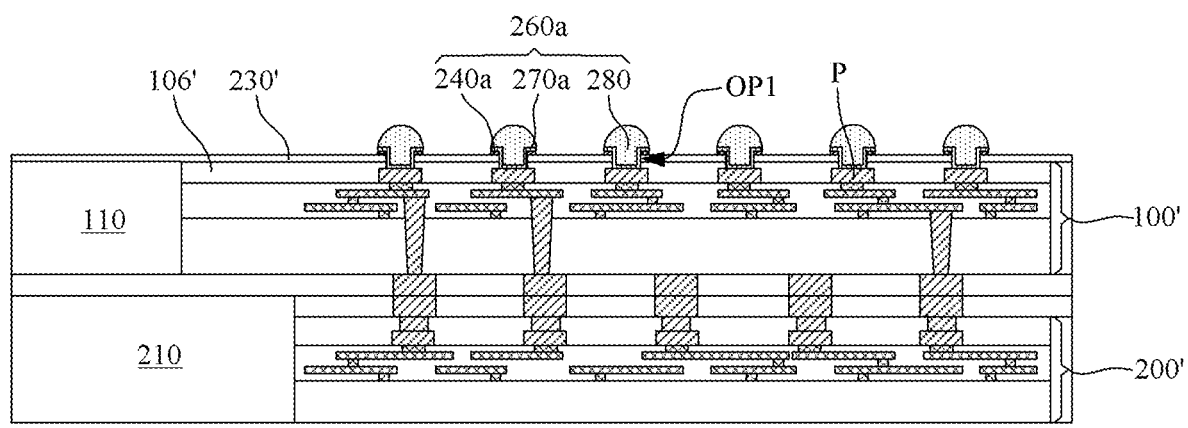

FIG. 12 and FIG. 14 are a cross-sectional view schematically illustrating another process flow for fabricating an SoIC component in accordance with some embodiments of the present disclosure.

Referring to FIG. 9 and FIG. 12, after performing the process illustrated in FIG. 9, the patterned photoresist layer PR1 (illustrated in FIG. 9) is removed through a stripping process, for example. A seed layer 270 is conformally formed to cover the anti-arcing pattern 240' and the pads P of the semiconductor die 100' through sputtering, for example. The sputtered seed layer 270 not only cover top surface of the anti-arcing pattern 240', but also extends along and covers the side surfaces of the patterned dielectric layer 106', the patterned passivation layer 230', and the anti-arcing pattern 240'. In some embodiments, the seed layer 270 includes a sputtered Ti/Cu seed layer. After forming the seed layer 270, a patterned photoresist layer PR2 is formed on the seed layer 270, and the patterned photoresist layer PR2 includes multiple openings for exposing portions of the seed layer 270. A plating process may be performed to form conductive posts 280 in the openings defined in the patterned photoresist layer PR2.

Figure 13:
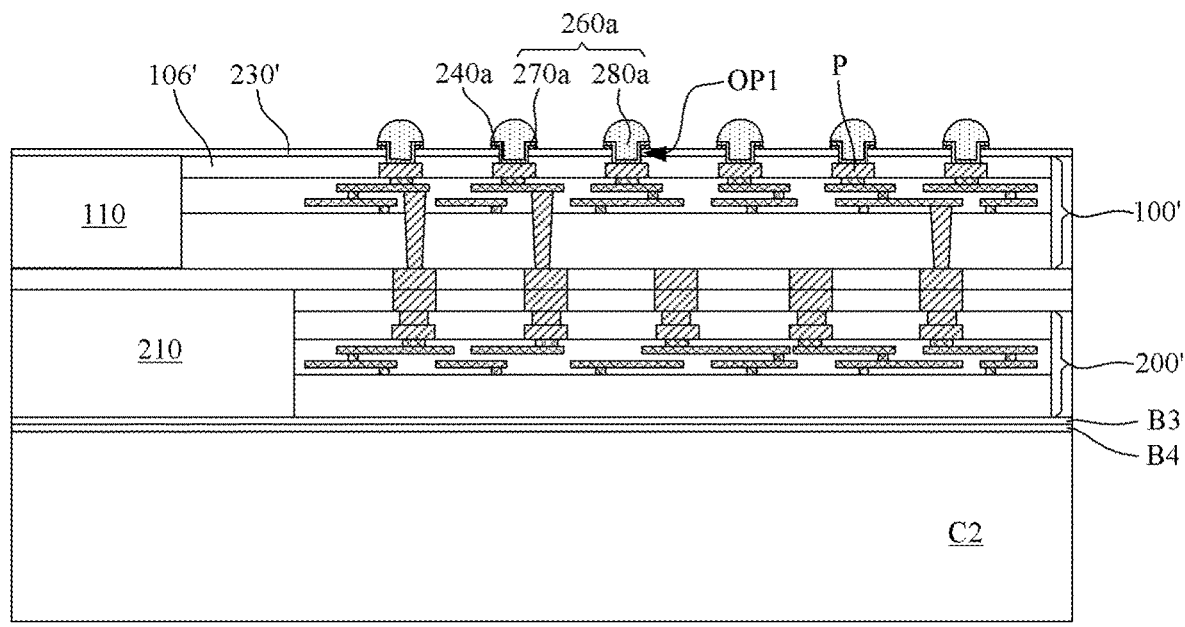

Referring to FIG. 12 and FIG. 13, the patterned photoresist layer PR2 are removed from the seed layer 270 through a stripping process, for example. After removing the patterned photoresist layer PR2, portions of the seed layer 270 that are not covered by the conductive posts 280 are exposed. A patterning process is performed to remove the exposed portions of the seed layer 270 and the anti-arcing pattern 240' located under the seed layer 270 until the patterned passivation layer 230' are revealed. After performing the above-mentioned patterning process, a reflow process may be performed to reshape the conductive posts 280 such that anti-arcing patterns 240a and conductive bump 280a are formed over the semiconductor die 100', wherein each of the conductive terminals 260a includes the seed pattern 270a and the conductive bump 280a on the seed pattern 270a, the seed pattern 270a covers the anti-arcing pattern 240' and extends into the first openings OP1, and the conductive bump 280a is spaced apart from the anti-arcing pattern 240' by the seed pattern 270a. The conductive terminals 260a may electrically connected to and directly cover the anti-arcing patterns 240a. In some embodiments, the anti-arcing pattern 240a is disposed on the top surface of the passivation layer 230' and distributed outside the first openings OP1 of the passivation layer 230'. Furthermore, the top surface of the anti-arcing pattern 240a may be entirely covered by the seed pattern 270a of the conductive terminals 260a.

Referring to FIG. 13 and FIG. 14, after forming the conductive terminals 260a, a de-bonding process is performed such that an SoIC de-bonded from the carrier C2 is obtained. In some other embodiments where multiple semiconductor dies 100' and multiple semiconductor dies 200' are used, a singulation process is further performed such that multiple singulated SoICs may be obtained.

As illustrate in FIG. 11 and FIG. 14, the SoIC illustrated in FIG. 14 is similar with that illustrated in FIG. 11 except for configuration of the conductive terminals 260a formed on the semiconductor dies 100'.

FIG. 15 through FIG. 19 are cross-sectional views schematically illustrating still another process flow for fabricating an SoIC component in accordance with other embodiments of the present disclosure.

Figure 15:
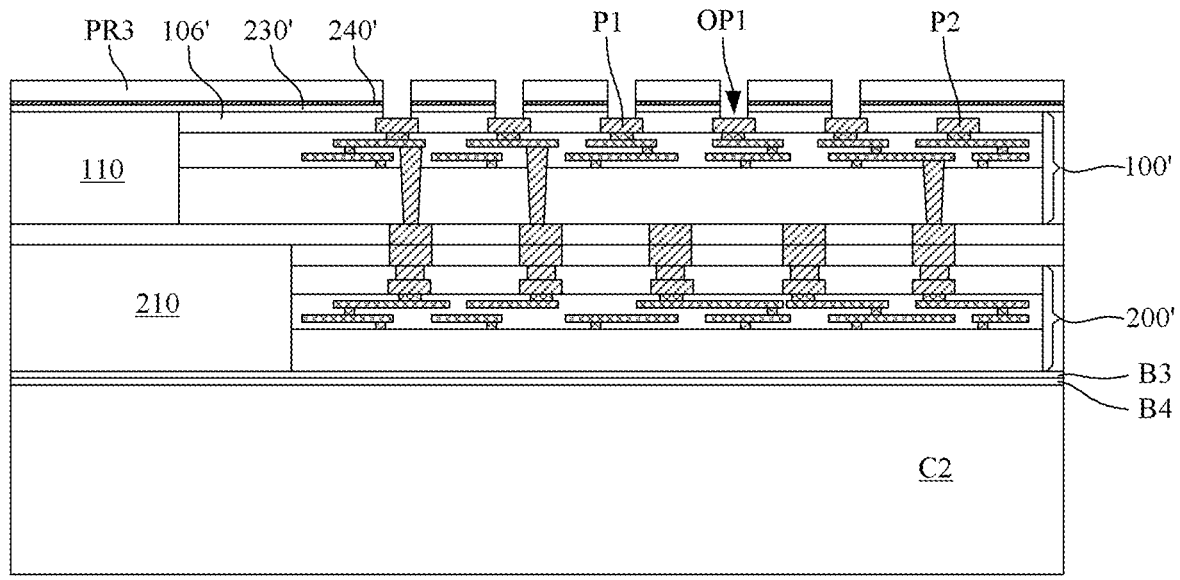
FIG. 15 through FIG. 19 are cross-sectional views schematically illustrating still another process flow for fabricating an SoIC component in accordance with other embodiments of the present disclosure.

Referring to FIG. 8 and FIG. 15, after performing the process illustrated in FIG. 8, a patterning process of the dielectric layer 106, the passivation layer 230, and the anti-arcing material layer 240 is performed such that a patterned dielectric layer 106', a patterned passivation layer 230', and an anti-arcing pattern 240' are formed. Multiple first openings OP1 are formed in the patterned dielectric layer 106', the patterned passivation layer 230', and the anti-arcing pattern 240' such that top surfaces of the pads P1 (e.g., copper pads) of the semiconductor die 100' are partially exposed by the first openings OP1, and the pads P2 of the semiconductor die 100' are not exposed. The pads P2 of the semiconductor die 100' are covered by the patterned dielectric layer 106', the patterned passivation layer 230', and the anti-arcing pattern 240'. In some embodiments, as illustrated in FIG. 15, a photolithography process is performed to form a patterned photoresist layer PR3 on the anti-arcing material layer 240, and an etching process (e.g. a dry etching process) is performed to remove portions of the dielectric layer 106, the passivation layer 230, and the anti-arcing material layer 240 that are not covered by the patterned photoresist layer PR3 until the top surfaces of the pads P1 (e.g., copper pads) of the semiconductor die 100' are partially exposed. The number of the pads P1 and the number of the pads P2 are not limited in the present application.

In an embodiment where the first openings OP1 are formed by a dry etching process (e.g., a plasma dry etching process), since charge accumulation occurred around the first openings OP1 is minimized by the anti-arcing material layer 240 or the anti-arcing pattern 240', arcing damage issue of the pads P1 (e.g., copper pads) of the semiconductor die 100' may be improved.

Figure 16:
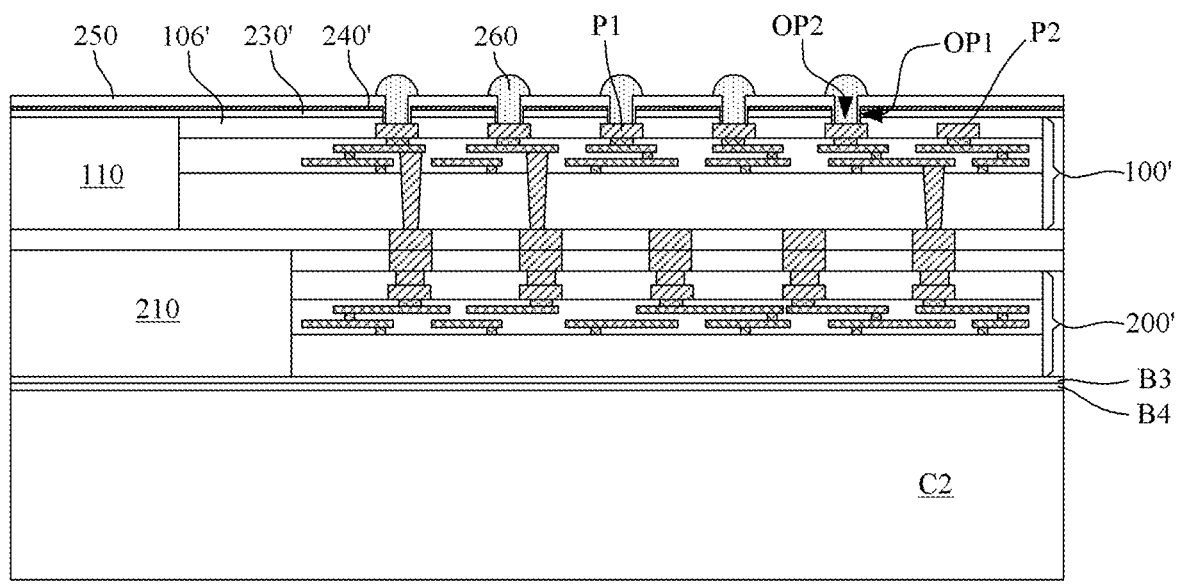

Referring to FIG. 15 and FIG. 16, after forming the first openings OP1, the patterned photoresist layer PR3 is removed from the anti-arcing pattern 240' through a stripping process, for example. After the removal of the patterned photoresist layer PR3, a post passivation layer 250 including second openings OP2 is formed to cover the patterned dielectric layer 106', the patterned passivation layer 230', and the anti-arcing pattern 240'. The first openings OP1 are wider than the second openings OP2. The post passivation layer 250 may extend into the first openings OP1, and portions of the pads P1 of the semiconductor die 100' are revealed by the second openings OP2 defined in the post passivation layer 250. A plating process may be performed such that multiple conductive terminals 260 are formed on the revealed portions of the pads P1 of the semiconductor die 100'. As illustrated in FIG. 16, the conductive terminals 260 may land on the pads P1 of the semiconductor die 100', fill the second openings OP2 defined in the post passivation layer 250, and protrude from the top surface of the post passivation layer 250. Furthermore, the conductive terminals 260 may be spaced apart from the anti-arcing pattern 240' by the post passivation layer 250. In some embodiments, as illustrated in FIG. 16, no seed layer is formed between the conductive terminals 260 and the post passivation layer 250.

Figure 17:
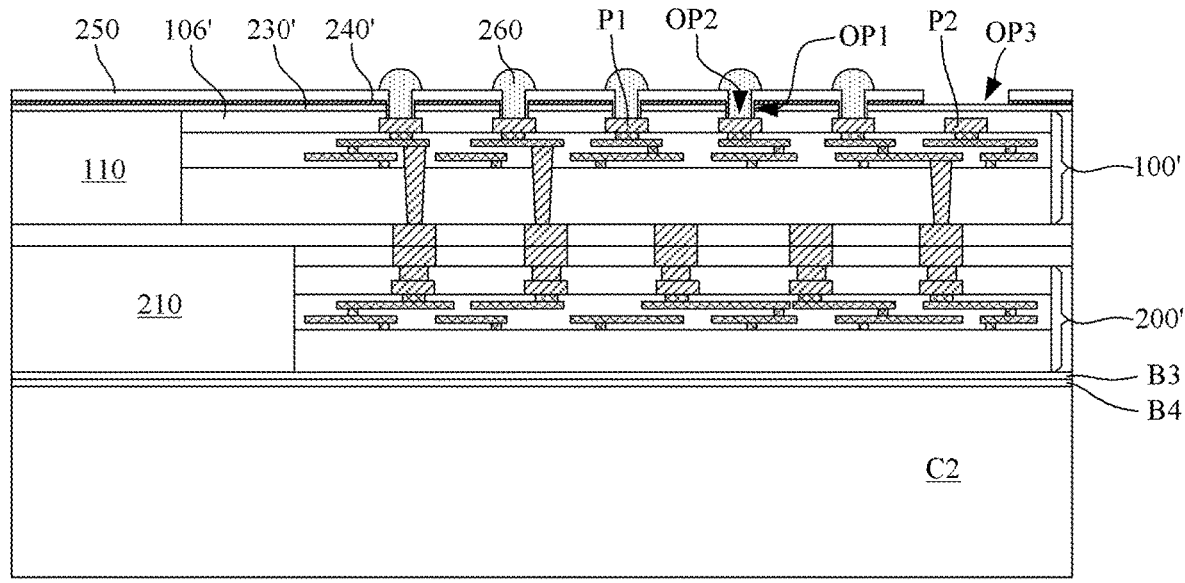

Referring to FIG. 17, the post passivation layer 250 and the anti-arcing pattern 240' are patterned to form a third opening OP3 for exposing a portion of the patterned passivation layer 230'. The third opening OP3 is located above the pads P2 of the semiconductor die 100'. Furthermore, the third opening OP3 may be wider than the first openings OP1 and the second openings OP2.

Figure 18:
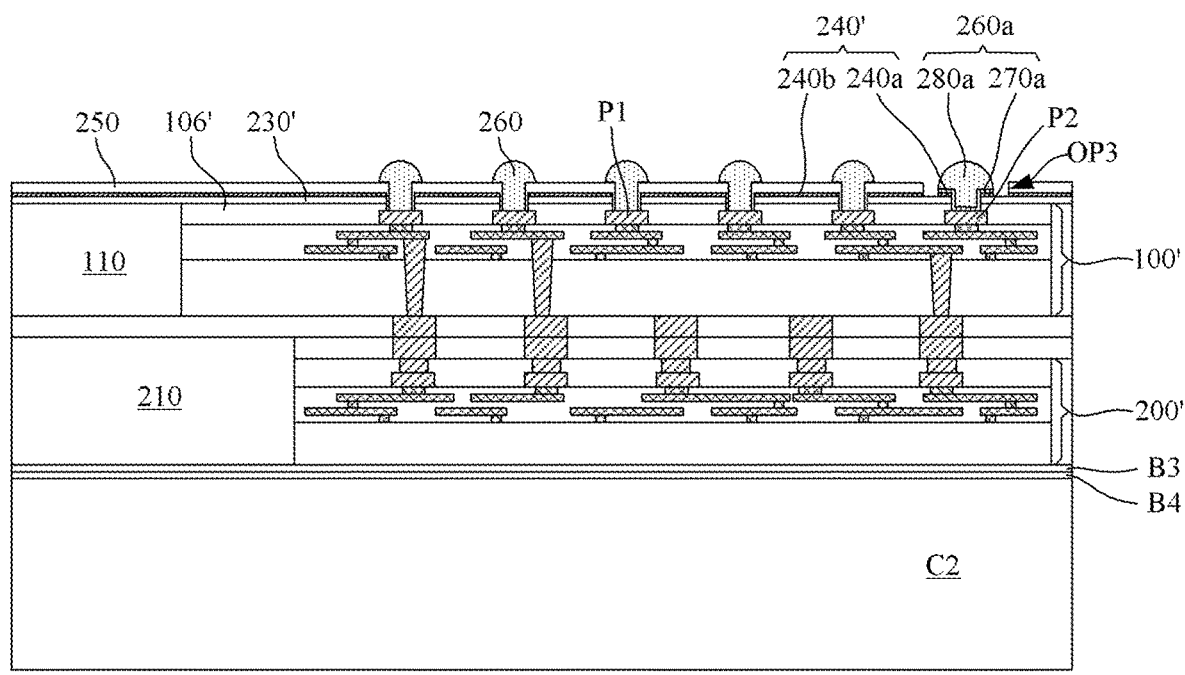

Referring to FIG. 17 and FIG. 18, one or more fourth openings OP4 are formed in the patterned dielectric layer 106' and the patterned passivation layer 230'. A photolithography process followed by an etching process (e.g. a dry etching process) is performed to remove portions of the patterned dielectric layer 106' and the patterned passivation layer 230' until the top surfaces of the pads P2 of the semiconductor die 100' are partially exposed by the fourth openings OP4. The number of the fourth openings OP4 and the number of the pads P2 are not limited in the present application. In an embodiment where the fourth openings OP4 are formed by a dry etching process (e.g., a plasma dry etching process), since charge accumulation occurred around the fourth openings OP4 can be minimized by the anti-arcing pattern 240' or 240b, arcing damage issue of the pads P2 of the semiconductor die 100' may be improved.

Conductive terminals 260a electrically connected to the pads P2 of the semiconductor die 100' are formed to fill the fourth openings OP4. In some embodiments, the conductive terminals 260a each includes a seed pattern 270a and a conductive bump 280a covering the seed pattern 270a. As illustrated in FIG. 18, the height of the conductive terminals 260a may be substantially equal to the height of the conductive terminals 260, and the lateral dimension (e.g., maximum width) of the conductive terminals 260a may be greater than the lateral dimension (e.g., maximum width) of the conductive terminals 260. The fabrication processes of the conductive terminals 260a illustrated in FIG. 18 are similar with those illustrated in FIGS. 12 and 13. Detailed descriptions regarding to fabrication processes of the conductive terminals 260a are thus omitted.

As illustrated in FIG. 18, after the conductive terminals 260a are formed, the anti-arcing pattern 240' may include a first portion 240a and a second portion 240b, the first portion 240a of the anti-arcing pattern 240' is located between the patterned passivation layer 230' and the conductive terminals 260a, and the second portion 240b of the anti-arcing pattern 240' is located between the patterned passivation layer 230' and the post passivation layer 250. The first portion 240a of the anti-arcing pattern 240' is spaced apart from the second portion 240b of the anti-arcing pattern 240'. Furthermore, the first portion 240a of the anti-arcing pattern 240' is distributed in the third openings OP3.

Figure 19:
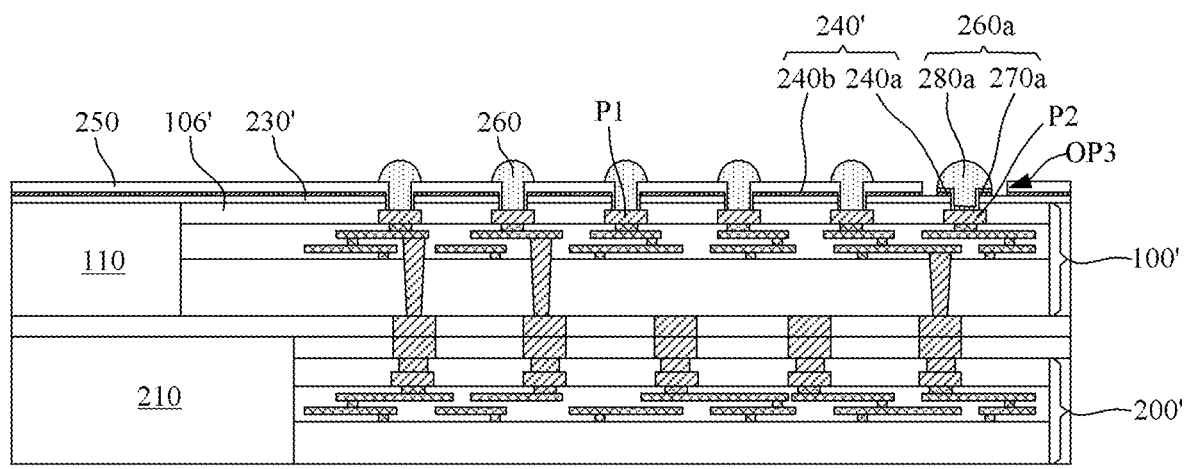

Referring to FIG. 18 and FIG. 19, after forming the conductive terminals 260a, a de-bonding process is performed such that an SoIC de-bonded from the carrier C2 is obtained. In some other embodiments where multiple semiconductor dies 100' and multiple semiconductor dies 200' are used, a singulation process is further performed such that multiple singulated SoICs are obtained.

As illustrate in FIG. 11 and FIG. 19, the SoIC illustrated in FIG. 19 is similar with that illustrated in FIG. 11 except that the SoIC illustrated in FIG. 19 includes both the conductive terminals 260 and 260a.

In the above-described embodiments, the anti-arcing pattern may minimize arcing damage issue of the pads of the semiconductor die. Accordingly, the fabrication yield may increase.

In accordance with some embodiments of the disclosure, a semiconductor structure including a first semiconductor die, a second semiconductor die, a passivation layer, an anti-arcing pattern, and conductive terminals is provided. The second semiconductor die is stacked over the first semiconductor die. The passivation layer covers the second semiconductor die and includes first openings for revealing pads of the second semiconductor die. The anti-arcing pattern is disposed over the passivation layer. The conductive terminals are disposed over and electrically connected to the pads of the second semiconductor die. In some embodiments, a top surface of the anti-arcing pattern is entirely covered by the conductive terminals. In some embodiments, the anti-arcing pattern is distributed outside the first openings of the passivation layer. In some embodiments, the conductive terminals each includes a seed pattern and a bump on the seed pattern, the seed pattern covers the anti-arcing pattern and extends into the first openings, and the bump is spaced apart from the anti-arcing pattern by the seed pattern. In some embodiments, the semiconductor structure further includes a post passivation layer, wherein the anti-arcing pattern is disposed on a top surface of the passivation layer, the anti-arcing pattern includes a first portion and a second portion, the first portion of the anti-arcing pattern is located between the passivation layer and first conductive terminals among the conductive terminals, and the second portion of the anti-arcing pattern is located between the passivation layer and the post passivation layer. In some embodiments, the post passivation layer extends into the first openings and includes second openings for revealing portions of the pads of the second semiconductor die, and second conductive terminals among the conductive terminals are electrically connected to the portions of the pads of the second semiconductor die though the second openings of the post passivation layer. In some embodiments, the post passivation layer includes third openings wider than the first openings of the passivation layer, and the first portion of the anti-arcing pattern is distributed in the third openings. In some embodiments, the semiconductor further includes a post passivation layer covering the passivation layer and the anti-arcing pattern, wherein the post passivation layer extends into the first openings and includes second openings for revealing portions of the pads of the second semiconductor die, and the anti-arcing pattern is between the post passivation layer and the passivation layer. In some embodiments, the anti-arcing pattern is spaced apart from the conductive terminals by the post passivation layer.

In accordance with some other embodiments of the disclosure, a semiconductor structure including a first semiconductor die, a second semiconductor die, an insulating encapsulation, a passivation layer, a charge spreading pattern, and conductive terminals is provided. The first semiconductor die includes a first semiconductor substrate, a first interconnect structure over the first semiconductor substrate, and a first bonding structure over the first interconnect structure. The second semiconductor die is stacked over the first semiconductor die. The second semiconductor die includes a second semiconductor substrate, a second interconnect structure, and a second bonding structure, wherein the second interconnect structure and the second bonding structure are disposed on opposite surfaces of the second semiconductor substrate, and the second semiconductor die is electrically connected the first semiconductor die through the first and second bonding structures. The insulating encapsulation laterally encapsulates the first and second semiconductor dies. The passivation layer is disposed over the second interconnect structure of the second semiconductor die and includes first openings for revealing pads of the second semiconductor die. The conductive terminals are disposed over and electrically connected to the pads of the second semiconductor die. The charge spreading pattern disposed between the conductive terminals and the passivation layer. In some embodiments, insulating encapsulation comprises a first encapsulation portion and a second encapsulation portion, the first semiconductor die is laterally encapsulated by the first encapsulation portion, and the second semiconductor die is laterally encapsulated by the second encapsulation portion. In some embodiments, the charge spreading pattern is distributed outside the first openings of the passivation layer, a top surface of the charge spreading pattern is entirely covered by the conductive terminals, the conductive terminals each includes a seed pattern and a bump on the seed pattern, the seed pattern covers the charge spreading pattern and extends into the first openings, and the bump is spaced apart from the charge spreading pattern by the seed pattern. In some embodiments, the semiconductor structure further includes a post passivation layer, wherein the charge spreading pattern is disposed on a top surface of the passivation layer and includes a first portion and a second portion, the first portion of the charge spreading pattern is located between the passivation layer and parts of the conductive terminals, and the second portion of the charge spreading pattern is located between the passivation layer and the post passivation layer. In some embodiments, the semiconductor structure further includes a post passivation layer covering the passivation layer and the charge spreading pattern, wherein the post passivation layer extends into the first openings and includes second openings for revealing portions of the pads of the second semiconductor die, and the charge spreading pattern is between the post passivation layer and the passivation layer. In some embodiments, the charge spreading pattern is electrically floating.

In accordance with some other embodiments of the disclosure, a method including the followings is provided. An upper tier semiconductor die is bonded to a bottom tier semiconductor die, wherein the upper tier semiconductor die comprises pads. A passivation layer is formed over a top surface of the upper tier semiconductor die. An anti-arcing pattern is formed over the passivation layer, wherein the passivation layer comprises openings for revealing the pads of the upper tier semiconductor die. Conductive terminals are formed over the upper tier semiconductor die, wherein the conductive terminals are electrically connected to the pads of the upper tier semiconductor die. In some embodiments, the anti-arcing pattern is electrically connected to the conductive terminals after forming the conductive terminals over the upper tier semiconductor die. In some embodiments, the anti-arcing pattern is formed by depositing an anti-arcing material followed by a patterning process, and the patterning process is performed by using the conductive terminals as a mask. In some embodiments, the method further includes: forming a post passivation layer over the passivation layer to cover at least a portion of the anti-arcing pattern. In some embodiments, the anti-arcing pattern is electrically insulated from the conductive terminals after forming the conductive terminals over the upper tier semiconductor die.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A structure, comprising:
    a first semiconductor die;
    a second semiconductor die stacked over the first semiconductor die, and the second semiconductor die comprising pads;
    a first bonding structure disposed between the first semiconductor die and the second semiconductor die;
    a second bonding structure disposed between the first bonding structure and the second semiconductor die;
    a first encapsulation portion laterally encapsulating the first semiconductor die and the first bonding structure;
    a second encapsulation portion laterally encapsulating the second semiconductor die;
    a passivation layer disposed over a top surface of the second semiconductor die and the second encapsulation portion;
    an anti-arcing pattern disposed over the passivation layer;
    a post passivation layer disposed over the passivation layer to cover a first portion of the anti-arcing pattern; and
    conductive terminals over the second semiconductor die, wherein the conductive terminals are electrically connected to the pads of the second semiconductor die, wherein the first portion of the anti-arcing pattern is electrically insulated from the conductive terminals.

2. The structure as claimed in claim 1, wherein a second portion of the anti-arcing pattern is covered by and electrically connected to the conductive terminals.

3. The structure as claimed in claim 1, wherein sidewalls of the first encapsulation are substantially aligned with sidewalls of the second encapsulation portion.

4. The structure as claimed in claim 2, wherein the second portion of the anti-arcing pattern is spaced apart from the first portion of the anti-arcing pattern.

5. The structure as claimed in claim 1, wherein the first portion of the anti-arcing pattern is spaced apart from the conductive terminals by the post passivation layer.

6. The structure as claimed in claim 1, wherein sidewalls of the first bonding structure laterally offset from sidewalls of the second encapsulation portion, and the sidewalls of the first bonding structure are in contact with the first encapsulation portion.

7. The structure as claimed in claim 1, wherein sidewalls of the second bonding structure are substantially aligned with sidewalls of the second encapsulation portion.

8. The structure as claimed in claim 1, wherein sidewalls of the first bonding structure laterally offset from sidewalls of the second bonding structure.

9. The structure as claimed in claim 1, wherein the first encapsulation portion is spaced apart from the second encapsulation portion by the second bonding structure.

10. The structure as claimed in claim 1, wherein the first encapsulation portion is in contact with the first bonding structure and the second bonding structure.

11. A structure, comprising:
    a first semiconductor die;
    a second semiconductor die disposed over the first semiconductor die;
    a first bonding structure disposed between the first semiconductor die and the second semiconductor die, and sidewalls of the first bonding structure being substantially aligned with sidewalls of the first semiconductor die;

a second bonding structure disposed between the first bonding structure and the second semiconductor die;
a first encapsulation portion laterally encapsulating the first semiconductor die and the first bonding structure, and the first encapsulation portion being in contact with the sidewalls of the first bonding structure;
a second encapsulation portion laterally encapsulating the second semiconductor die, and sidewalls of the second encapsulation portion being substantially aligned with sidewalls of the second bonding structure;
a passivation layer disposed over a top surface of the second semiconductor die and the second encapsulation portion;
an anti-arcing pattern disposed over the passivation layer;
a post passivation layer disposed over the passivation layer to cover the anti-arcing pattern; and
conductive terminals over the second semiconductor die, wherein the conductive terminals are electrically connected to the second semiconductor die, wherein the anti-arcing pattern comprises a first portion and a second portion, the first portion of the anti-arcing pattern is covered by the post passivation layer, the first portion of the anti-arcing pattern is electrically insulated from the conductive terminals.

12. The structure as claimed in claim 11, wherein the second portion of the anti-arcing pattern is covered by and electrically connected to the conductive terminals.

13. The structure as claimed in claim 11, wherein sidewalls of the first encapsulation are substantially aligned with sidewalls of the second encapsulation portion.

14. The structure as claimed in claim 11, wherein the second portion of the anti-arcing pattern is spaced apart from the first portion of the anti-arcing pattern.

15. The structure as claimed in claim 11, wherein the first portion of the anti-arcing pattern is spaced apart from the conductive terminals by the post passivation layer.

16. The structure as claimed in claim 11, wherein the sidewalls of the first bonding structure offset from sidewalls of the second bonding structure.

17. A structure, comprising:
a first semiconductor die laterally encapsulated by a first encapsulation portion;
a second semiconductor die laterally encapsulated by a second encapsulation portion;
a first bonding structure disposed between the first semiconductor die and the second semiconductor die, the first bonding structure being laterally encapsulated by the first encapsulation portion;
a second bonding structure disposed between the first bonding structure and the second semiconductor die, wherein sidewalls of the first bonding structure and sidewalls of the second bonding structure are laterally offset, and the second encapsulation portion is spaced apart from the first semiconductor die, the first encapsulation portion as well as the first bonding structure by the second bonding structure;
a passivation layer disposed over a top surface of the second semiconductor die and the second encapsulation portion;
an anti-arcing pattern disposed over the passivation layer;
a post passivation layer disposed over the passivation layer to cover the anti-arcing pattern; and
conductive terminals over the second semiconductor die, wherein the conductive terminals are electrically connected to the second semiconductor die.

18. The structure as claimed in claim 17, wherein the anti-arcing pattern comprises a first portion and a second portion, the first portion of the anti-arcing pattern is covered by the post passivation layer, the first portion of the anti-arcing pattern is electrically insulated from the conductive terminals, and the second portion of the anti-arcing pattern is covered by and electrically connected to the conductive terminals.

19. The structure as claimed in claim 17, wherein sidewalls of the first encapsulation and sidewalls of the second encapsulation portion are substantially aligned with sidewalls of the second bonding structure.

20. The structure as claimed in claim 18, wherein the second portion of the anti-arcing pattern is spaced apart from the first portion of the anti-arcing pattern.

* * * * *